(12) United States Patent
Kim et al.

(10) Patent No.: US 12,590,930 B2
(45) Date of Patent: Mar. 31, 2026

(54) TRANSPARENT ULTRASOUND SENSOR AND METHOD FOR MANUFACTURING THE SAME

(71) Applicant: POSTECH ACADEMY—INDUSTRY FOUNDATION, Pohang-si (KR)

(72) Inventors: Chulhong Kim, Pohang-si (KR); Hyung Ham Kim, Pohang-si (KR); Byullee Park, Gwangju (KR); Jeongwoo Park, Daegu (KR)

(73) Assignee: POSTECH ACADEMY—INDUSTRY FOUNDATION, Pohang-si (KR)

( * ) Notice: Subject to any disclaimer, the term of this patent is extended or adjusted under 35 U.S.C. 154(b) by 739 days.

(21) Appl. No.: 17/762,008

(22) PCT Filed: Apr. 9, 2020

(86) PCT No.: PCT/KR2020/004846
§ 371 (c)(1),
(2) Date: Jun. 10, 2022

(87) PCT Pub. No.: WO2021/054558
PCT Pub. Date: Mar. 25, 2021

(65) Prior Publication Data
US 2022/0334086 A1 Oct. 20, 2022

(30) Foreign Application Priority Data
Sep. 20, 2019 (KR) ........................ 10-2019-0116186

(51) Int. Cl.
*G01N 29/14* (2006.01)
*G10K 11/02* (2006.01)
*H10N 30/87* (2023.01)
(52) U.S. Cl.
CPC ............. *G01N 29/14* (2013.01); *G10K 11/02* (2013.01); *H10N 30/87* (2023.02)

(58) Field of Classification Search
CPC .... G01N 29/14; G01N 29/04; G01N 29/2437; G01N 29/2418; G10K 11/02;
(Continued)

(56) References Cited

U.S. PATENT DOCUMENTS 5,488,954 A * 2/1996 Sleva .................... B06B 1/0685
600/463
5,488,957 A * 2/1996 Frey ........................ G10K 11/30
600/472
(Continued)

FOREIGN PATENT DOCUMENTS

JP S60143743 A 7/1985
JP S61-225611 A2 10/1986
(Continued)

OTHER PUBLICATIONS

International Search Report for Application No. PCT/KR2020/004846, mailed Jul. 17, 2020, 5 pages including translation.
(Continued)

*Primary Examiner* — Jacques M Saint Surin
(74) *Attorney, Agent, or Firm* — Morgan, Lewis & Bockius LLP

(57) ABSTRACT

Disclosed herein is a transparent ultrasonic sensor including a matching unit configured to perform optical impedance matching and formed of a transparent material, a piezoelectric layer positioned behind the matching unit and formed of a transparent material, a first electrode layer and a second electrode layer positioned on a rear surface and a front surface of the piezoelectric layer, respectively, the first electrode layer and the second electrode layer being formed of a transparent conductive material, a first housing connected to the first electrode layer, and a second housing connected to the second electrode layer.

20 Claims, 12 Drawing Sheets

(58) Field of Classification Search

CPC ........ G10K 11/30; H10N 30/87; H10N 30/20; H10N 30/853; H10N 30/857; B06B 1/067; A61B 8/00

USPC ......................................................... 73/587

See application file for complete search history.

(56) References Cited

U.S. PATENT DOCUMENTS

| | | | |
|---|---|---|---|
| 6,776,763 B2 * | 8/2004 | Nix | B06B 1/0633 |
| | | | 29/25.35 |
| 6,857,501 B1 * | 2/2005 | Han | H04R 17/00 |
| | | | 29/594 |
| 8,879,352 B2 | 11/2014 | Witte et al. | |
| 11,609,326 B2 * | 3/2023 | Lam | G10K 11/02 |
| 11,768,288 B2 * | 9/2023 | Lam | G01H 11/08 |
| | | | 367/7 |
| 2003/0187319 A1 | 10/2003 | Kaneko et al. | |
| 2005/0187471 A1 | 8/2005 | Kanayama et al. | |
| 2007/0291275 A1 | 12/2007 | Diamond | |
| 2009/0005685 A1 | 1/2009 | Nagae et al. | |
| 2010/0268042 A1 | 10/2010 | Wang et al. | |
| 2010/0268058 A1 | 10/2010 | Chen | |
| 2011/0190617 A1 | 8/2011 | Chen | |
| 2012/0029829 A1 | 2/2012 | Li et al. | |
| 2013/0042688 A1 | 2/2013 | Luo et al. | |
| 2013/0109950 A1 | 5/2013 | Herzog et al. | |
| 2013/0190591 A1 | 7/2013 | Hirson et al. | |
| 2014/0182385 A1 | 7/2014 | Oh et al. | |
| 2014/0350368 A1 | 11/2014 | Irisawa | |
| 2014/0355387 A1 | 12/2014 | Kitchens, II et al. | |
| 2015/0265155 A1 | 9/2015 | Zalev et al. | |
| 2016/0150973 A1 | 6/2016 | Abe | |
| 2017/0065182 A1 | 3/2017 | Wang et al. | |
| 2017/0079622 A1 | 3/2017 | O'Donnell et al. | |
| 2017/0215737 A1 | 8/2017 | Suehira et al. | |
| 2017/0231503 A1 | 8/2017 | Nakatsuka et al. | |
| 2018/0055369 A1 | 3/2018 | Burns et al. | |
| 2018/0233651 A1 | 8/2018 | Bang | |
| 2018/0309043 A1 | 10/2018 | Kobrin et al. | |
| 2018/0368697 A1 | 12/2018 | Fukutani et al. | |
| 2019/0050618 A1 | 2/2019 | Khuri-Yakub et al. | |
| 2019/0076119 A1 | 3/2019 | Yang et al. | |
| 2019/0090734 A1 | 3/2019 | Komiyama et al. | |
| 2020/0069189 A1 | 3/2020 | Schwarz | |
| 2020/0173965 A1 | 6/2020 | Sangu | |
| 2021/0050507 A1 | 2/2021 | Li et al. | |
| 2022/0133273 A1 | 5/2022 | Dangi et al. | |
| 2022/0183564 A1 | 6/2022 | Xia et al. | |
| 2024/0163615 A1 * | 5/2024 | Takekuma | H04R 17/005 |

FOREIGN PATENT DOCUMENTS

| | | |
|---|---|---|
| JP | H0833097 A | 2/1996 |
| JP | 2001299758 A | 10/2001 |
| JP | 2004-057806 A2 | 2/2004 |
| JP | 2004147940 A | 5/2004 |
| JP | 2004351023 A | 12/2004 |
| JP | 2005021380 A | 1/2005 |
| JP | 2005218684 A | 8/2005 |
| JP | 2007-136210 A2 | 6/2007 |
| JP | 2013106823 A | 6/2013 |
| JP | 2013-188330 A2 | 9/2013 |
| JP | 2013-188465 A2 | 9/2013 |
| JP | 2014-068751 A2 | 4/2014 |
| JP | 2015-062678 A2 | 4/2015 |
| JP | 2015116254 A | 6/2015 |
| JP | 2016007256 A | 1/2016 |
| JP | 2016-521999 A2 | 7/2016 |
| JP | 2018189498 A | 11/2018 |
| JP | 2019146967 A | 9/2019 |
| JP | 2020-034319 A2 | 3/2020 |
| JP | 2020-036898 A2 | 3/2020 |
| JP | 2020530622 A | 10/2020 |
| KR | 20150035850 A | 4/2015 |

| | | |
|---|---|---|
| KR | 10-20150135335 A | 12/2015 |
| KR | 20160089816 A | 7/2016 |
| KR | 10-1830109 B1 | 2/2018 |
| KR | 10-1830209 B1 | 2/2018 |
| KR | 10-20190028955 A | 3/2019 |
| KR | 20190031834 A | 3/2019 |
| KR | 20190116805 A | 10/2019 |
| KR | 102045470 B1 | 11/2019 |
| KR | 20200032227 A | 3/2020 |
| KR | 10-2020-0128785 A | 11/2020 |
| KR | 20200132084 A | 11/2020 |
| WO | 2014144923 A1 | 9/2014 |
| WO | 2020167870 A1 | 8/2020 |

OTHER PUBLICATIONS

Office Action in U.S. Appl. No. 18/301,202, dated Sep. 11, 2025, 26 pages.

Notice of Allowance in U.S. Appl. No. 18/116,229, dated Jul. 22, 2025, 20 pages.

Wang M et al: "A photoacoustic imager with infrared illumination through the CMUT chip", 2011 16th International Solid-State Sensors, Actuators and Microsystems Conference (Transducers 2011); Beijing, China; Jun. 5-9, 2011, IEEE, Piscataway, NJ, Jun. 5, 2011 (Jun. 5, 2011), pp. 2188-2191, XP031910730, DOI: 10.1109/TRANSDUCERS.2011.5969389 ISBN: 978-1-4577-0157-3.

Fang et al., "A Focused Optically Transparent PVDF Transducer for Photoacoustic Microscopy", 2019 (Year: 2019).

Chen et al., "Optical-Resolution Photoacoustic Microscopy Using Transparent Ultrasound Transducer", 2019 (Year: 2019).

Dangi et al., "Lithium niobate-based transparent ultrasound transducers for photoacoustic imaging", 2019 (Year: 2019).

Chen et al., "Transparent High-Frequency Ultrasonic Transducer for Photoacoustic Microscopy Application", 2020 (Year: 2020).

Xi et al., "Photoacoustic imaging based on MEMS mirror scanning", 2010 (Year: 2010).

Park et al., "Handheld Photoacoustic Microscopy Probe", 2017 (Year: 2017).

Office Action in Korean Application No. 10-2020-0039208, dated Dec. 2, 2021, 5 pages.

Office Action in Chinese Application No. 202080080138.0, dated Apr. 30, 2024, 7 pages.

Office Action in Japanese Application No. 2022-517355, dated Apr. 27, 2023, 6 pages including translation.

Office Action in Korean Application No. 10-2020-0110777, dated Aug. 26, 2021, 4 pages.

Office Action in Korean Application No. 10-2020-0110777, dated Feb. 23, 2022, 3 pages.

Office Action in Japanese Application No. 2023-514471, dated Feb. 6, 2024, 7 pages.

International Search Report and Written Opinion in Application No. PCT/KR2021/000106, dated Apr. 30, 2021, 18 pages.

Notice of Allowance in Korean Application No. 10-2021-0014148, dated Dec. 19, 2022, 6 pages.

Office Action in Korean Application No. 10-2021-0014148, dated May 24, 2022, 5 pages.

Office Action in EP 21923354.1, dated Mar. 12, 2025, 4 pages.

Office Action in Japanese Application No. 2023-546567, dated Jun. 4, 2024, 5 pages.

Office Action in U.S. Appl. No. 18/301,202, dated Sep. 18, 2024, 26 pages.

Office Action in U.S. Appl. No. 18/301,202, dated Mar. 31, 2025, 25 pages.

International Search Report and Written Opinion in Application No. PCT/KR2021/005468, dated Oct. 20, 2021, 16 pages including translation.

Park et al., "Optically Transparent Focused Transducers for Combined Photoacoustic and Ultrasound Microscopy", 2020 (Year: 2020).

Office Action in U.S. Appl. No. 18/116,229, dated Oct. 1, 2024, 14 pages.

Notice of Allowance in Japanese Application No. 2022-517355, dated Nov. 14, 2023, 3 pages.

(56) References Cited

OTHER PUBLICATIONS

Notice of Allowance in Japanese Application No. 2023-546567, dated Nov. 26, 2024, 3 pages.
Notice of Allowance in Japanese Application No. 2023-514471, dated Nov. 12, 2024, 3 pages.
Notice of Allowance in Korean Application No. 10-2020-0039208, dated Jun. 15, 2022, 5 pages.
Notice of Allowance in Korean Application No. 10-2020-0110777, dated Aug. 3, 2022, 5 pages.

* cited by examiner

15

13

Light

15

13

Light

TRANSPARENT ULTRASOUND SENSOR AND METHOD FOR MANUFACTURING THE SAME

TECHNICAL FIELD

The present disclosure relates to an ultrasonic sensor and a method for manufacturing the same, and more particularly, to a transparent ultrasonic sensor through which light is transmitted and a method for manufacturing the same.

BACKGROUND ART

Ultrasonic sensors or transducers enable measurement of physical distance measurement and image acquisition of an object based on a principle of converting electrical energy into sound energy using the characteristics of piezoelectric materials, transferring the converted energy to the object, and then converting reflected sound energy into an electrical signal.

Recently, a technology in which optical devices such as optical cameras and lasers and ultrasonic sensors are integrated for high-precision detecting operation, high-resolution images, and user convenience have been actively developed.

However, the existing ultrasonic sensors are opaque, and thus integration thereof with an optical device that requires a transparent medium is impossible, and it is also impossible to arrange an irradiated laser and the ultrasonic sensor on the same axis.

DISCLOSURE

Technical Problem

An object of the present disclosure is to simplify a structure of an optical system using an ultrasonic sensor by allowing light to pass through the entire ultrasonic sensor.

Another object of the present disclosure is to improve the clarity of an optical signal and the clarity of an ultrasonic image detected by a transparent ultrasonic sensor by adjusting a focus of an ultrasonic signal and light incident on the transparent ultrasonic sensor, reflected therefrom, and then incident thereon again.

Technical Solution

According to an embodiment of the present disclosure, a transparent ultrasonic sensor includes: a matching unit configured to perform optical impedance matching and formed of a transparent material; a piezoelectric layer positioned behind the matching unit and formed of a transparent material; a first electrode layer and a second electrode layer positioned on a rear surface and a front surface of the piezoelectric layer, respectively, the first electrode layer and the second electrode layer being formed of a transparent conductive material; a first housing connected to the first electrode layer; and a second housing connected to the second electrode layer.

The matching unit may include an acoustic lens.

The acoustic lens may have a concave shape or a convex shape.

The matching unit may contain at least one of transparent glass, transparent epoxy, and transparent silicone.

The piezoelectric layer may contain at least one of LNO, PMN-PT, PVDF, and PVDF-TrFE.

The first electrode layer and the second electrode layer may each contain at least one of AgNW, ITO, carbon nanotubes, and graphene.

Sizes of the first electrode layer and the second electrode layer may be different from each other.

Each of the first housing and the second housing may be formed in a ring shape having an empty space in the middle.

The first housing may be positioned in contact with an edge portion of the first electrode layer, and the second housing may be positioned in contact with an edge portion of the second electrode layer.

The piezoelectric layer, the first electrode layer, and the first housing may be positioned in the inner space of the second housing.

The first housing and the second housing may contain a conductive material.

The transparent ultrasonic sensor according to the above feature may further include a first signal line connected to the first housing and a second signal line connected to the second housing.

The transparent ultrasonic sensor according to the above feature may further include a rear layer positioned in contact with the first electrode layer and damping an ultrasonic signal.

The rear layer may be surrounded by the first housing.

The rear layer may contain transparent glass or transparent epoxy.

The transparent ultrasonic sensor according to the above feature may further include an insulating unit positioned between the first housing and the second housing and formed of a transparent insulating material.

The transparent ultrasonic sensor according to the above feature may further include a protective layer positioned in front of the matching unit and performing acoustic impedance matching.

The protective layer may contain parylene.

The transparent ultrasonic sensor according to the above feature may further include a correction lens positioned behind the matching layer, controlling a focus of light passing through the matching layer, and formed of a transparent material.

The correction lens may have a convex shape.

According to another embodiment of the present disclosure, a method for manufacturing a transparent ultrasonic sensor includes: positioning a piezoelectric layer on a substrate; forming a transparent first electrode layer on an exposed first surface of the piezoelectric layer; attaching a first housing to an edge portion of the first electrode layer to be positioned; forming a transparent rear layer on the first surface of the first electrode layer in which the first housing is not positioned; attaching a second housing at an edge portion of the substrate to be positioned spaced apart from the first housing; injecting a transparent insulating material between the first housing and the second housing to form an insulating unit to form a first preliminary transparent ultrasonic sensor; rotating the first preliminary transparent ultrasonic sensor positioned on the substrate by 180 degrees in an vertical direction to be positioned on the substrate; forming a transparent second electrode layer on an exposed second surface of the piezoelectric layer, a surface of the insulating unit, and a surface of the second housing; forming a transparent matching unit on the second electrode layer; and forming a transparent protective layer on the matching unit on the exposed first electrode layer.

The method may further include; turning the transparent ultrasonic sensor on which up to the protective layer over by 180 degrees is formed in an vertical direction to be positioned on the substrate, and forming a correction lens on the exposed rear layer.

The method may further include: turning the transparent ultrasonic sensor on which up to the protective layer is formed by 180 degrees in the vertical direction to be positioned on the substrate; and connecting a first signal line to the first housing and connecting a second signal line to the second housing.

Advantageous Effects

According to the feature, since all components present in an active region of a transparent ultrasonic sensor are formed of a transparent material through which light is transmitted, the degree of freedom in the arrangement of the optical system including the transparent ultrasonic sensor may be increased, and thus, the space may be efficiently used.

In addition, since the matching unit focuses the ultrasonic signal and light, the clarity of an image obtained from a signal output from the transparent ultrasonic sensor may be significantly improved. Accordingly, a shape of an object, as well as the presence of the object, in the obtained image may be definitely determined.

In addition, since the focus of light is additionally adjusted through the correction lens, the clarity of the image output from the transparent ultrasonic sensor may be further increased.

Since first and second signal lines through which external signals are input and output are connected to first and second housings positioned to surround the edge portion of the transparent ultrasonic sensor, the first and second signal lines may be freely connected without reducing a active region.

In addition, an optical element may be freely coupled to the second housing positioned at the outermost side, without reducing the active region.

DESCRIPTION OF DRAWINGS

FIGS. 2a and 2b illustrate diagrams of a transparent ultrasonic sensor manufactured according to an embodiment of the present disclosure, in which FIG. 2a is a diagram when even a plano-convex correction lens is attached, and FIG. 2b is a diagram of a rear side of a transparent ultrasonic sensor in which the correction lens and an acoustic lens are omitted.

BEST MODE

Figure 1A:
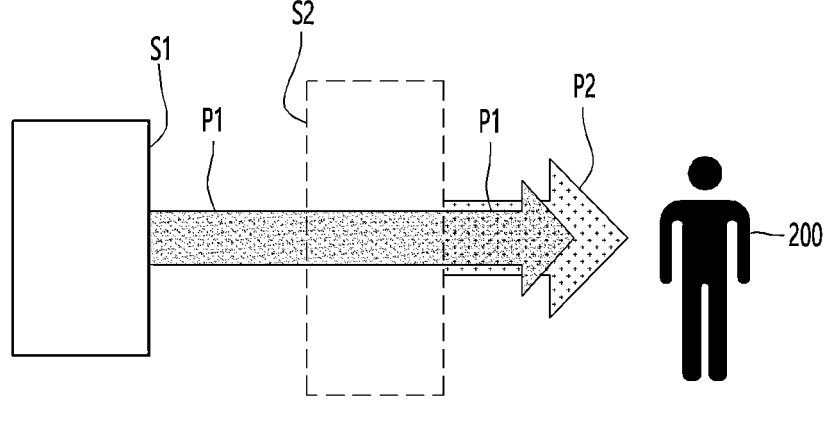
FIGS. 1a to 1d are conceptual views illustrating various arrangement relationships between a transparent ultrasonic sensor and an optical module according to an embodiment of the present disclosure.

Hereinafter, embodiments of the present disclosure will be described in detail with reference to the accompanying drawings. In describing the present disclosure, if it is determined that a detailed description of known functions and components associated with the present disclosure unnecessarily obscure the gist of the present disclosure, the detailed description thereof will be omitted. The terms used henceforth are used to appropriately express the embodiments of the present disclosure and may be altered according to a person of a related field or conventional practice. Therefore, the terms should be defined on the basis of the entire content of this specification.

Technical terms used in the present specification are used only in order to describe specific embodiments rather than limiting the present disclosure. The terms of a singular form may include plural forms unless referred to the contrary. It will be further understood that the terms "comprise" and/or "comprising," when used herein, specify the presence of stated features, integers, steps, operations, elements, and/or components, but do not preclude the presence or addition of one or more other features, regions, integers, steps, operations, elements, components, and/or groups thereof.

Hereinafter, a transparent ultrasonic sensor and a method of manufacturing the same according to an embodiment of the present disclosure will be described with reference to the accompanying drawings.

First, an operation concept of a transparent ultrasonic sensor 1 according to an embodiment of the present disclosure will be described with reference to FIGS. 1a to 1d.

FIGS. 1a to 1d show a schematic structure of an optical system using a transparent ultrasonic sensor 1.

As shown in FIGS. 1a to 1d, a light source module 100 irradiating light is positioned in front of the transparent ultrasonic sensor 1 and an object 200, to which light passing through the transparent ultrasonic sensor 1 is irradiated and then reflected toward the transparent ultrasonic sensor 1, is present behind the transparent ultrasonic sensor 1.

The light source module 100, serving to irradiate light toward the transparent ultrasonic sensor 1, may be a camera or a laser irradiator.

The transparent ultrasonic sensor 1 generates ultrasonic waves using light output from the light source module 100 and an electrical signal applied to the transparent ultrasonic sensor 1, irradiates the ultrasonic waves to the object 200, and outputs an electrical signal corresponding to ultrasonic waves incident after being reflected from the object 200, thereby obtaining an ultrasonic image of the object 200.

Such a transparent ultrasonic sensor 1 may transmit ultrasonic waves toward the object 200 using a piezoelectric effect and a converse piezoelectric effect and receive ultrasonic waves reflected from the object 20 to thereby generate the corresponding electrical signal.

In this case, the piezoelectric effect may be an effect of generating electricity by causing dielectric polarization when a mechanical force is applied to a piezoelectric material, and the converse piezoelectric effect may be a phenomenon causing contraction and relaxation when electricity is applied.

Like part of a human body, the object 200 reflects the ultrasonic waves applied from the transparent ultrasonic sensor 1 toward the transparent ultrasonic sensor 1 so that an ultrasonic image of the corresponding part which has reflected an ultrasonic signal may be obtained.

FIGS. 1a to 1d show various arrangement structures of the transparent ultrasonic sensor 1 positioned between the light source module 100 and the object 200.

FIG. 1a is a case in which the transparent ultrasonic sensor 1 is disposed such that a path of light output from the light source module 100 and a path of an ultrasonic signal output from the transparent ultrasonic sensor 1 are parallel to each other. That is, it is a case in which a light exit surface S1 of the light source module 100 and an incident surface S2 of the transparent ultrasonic sensor 1 adjacent to the light exit surface S1 are arranged in parallel to each other.

Therefore, in the case of FIG. 1a, a path P1 of light finally incident on the object 200 and an ultrasonic signal path P2 of the transparent ultrasonic sensor 1 may be the same or parallel to each other, so that an angle between the two paths P1 and P2 may be 0 degrees.

In this manner, as the optical module 100 is positioned behind the transparent ultrasonic sensor 1 or on the same path as the path P2 of the transparent ultrasonic sensor 1, the image of the object 200 positioned in front of the transparent ultrasonic sensor 1 may be obtained. In this case, a signal for the same position of the same object 200 may be obtained without distortion of the signal or light output from the optical ultrasonic sensor 1 and the optical module 100 to obtain an accurate image.

Figure 1B:
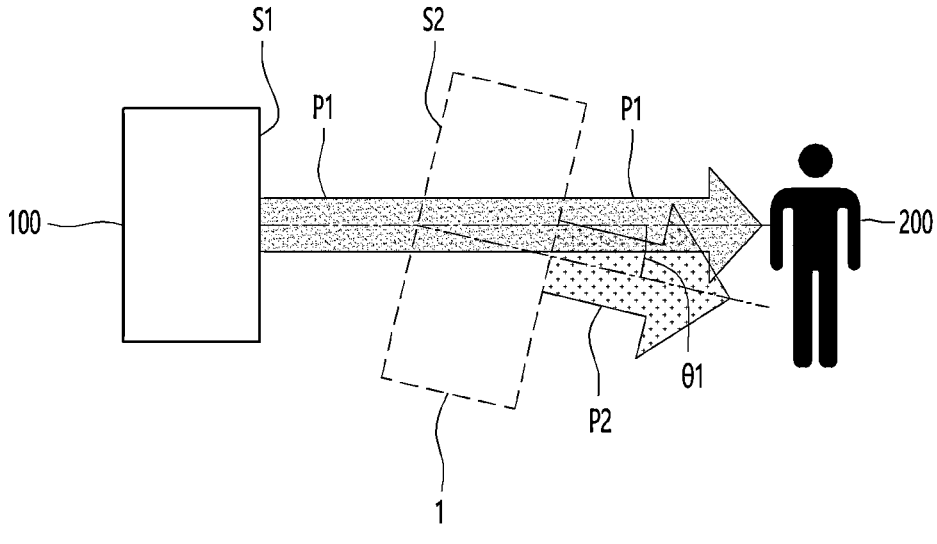
Figure 1C:
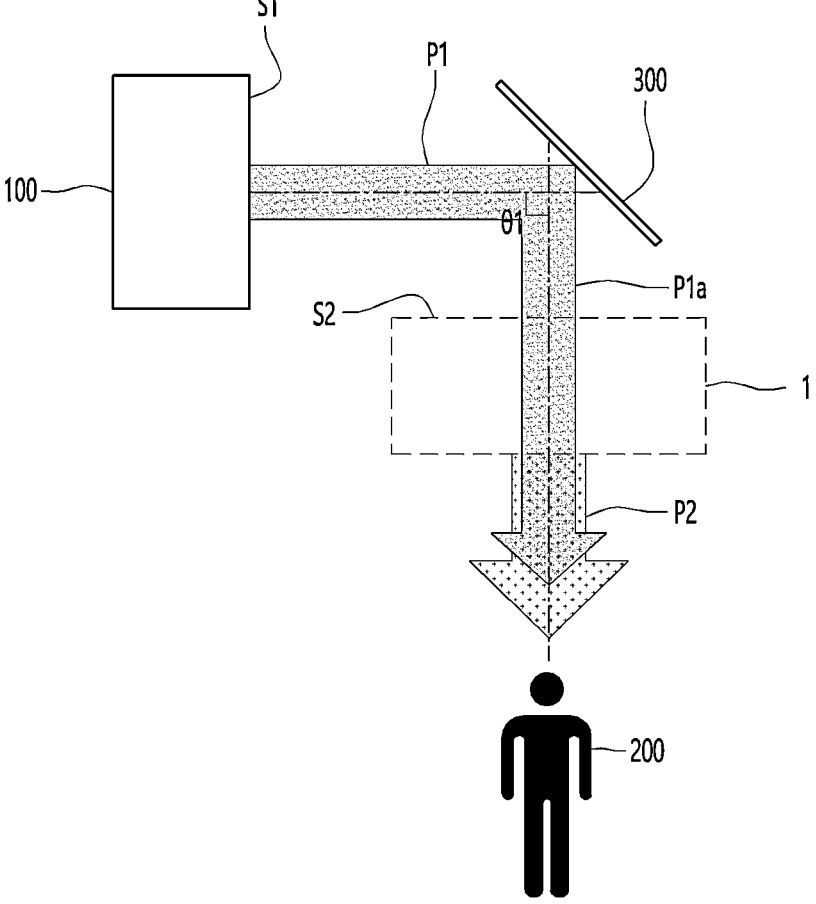
Figure 1D:
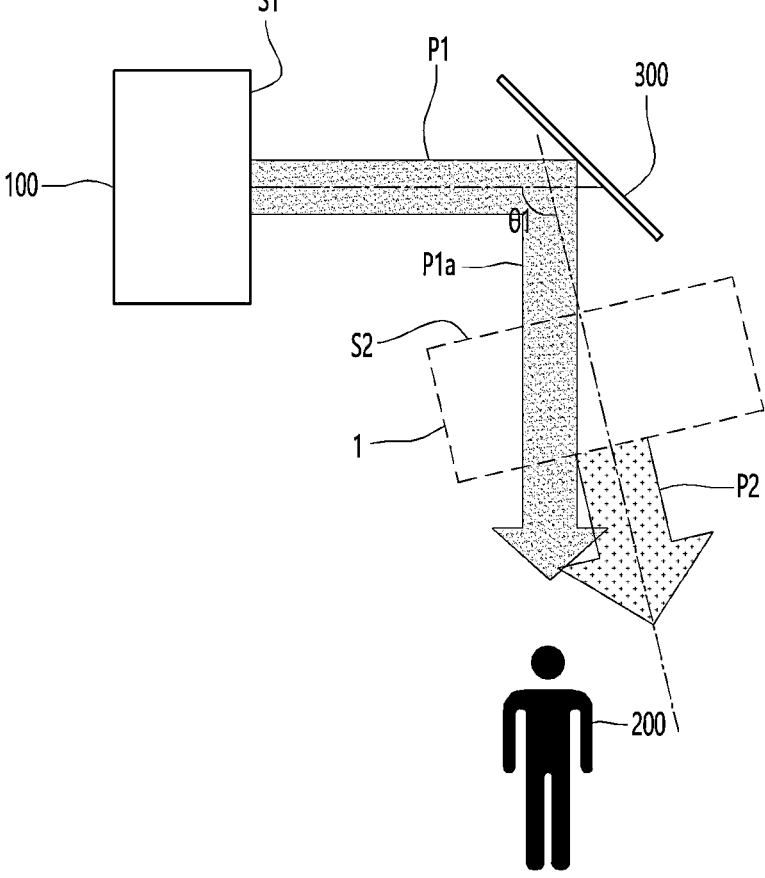

FIGS. 1b to 1d show a case in which the transparent ultrasonic sensor 1 is disposed between the optical module 100 and the object 200 such that the path P1 of light output from the light source module 100 and the path P2 of the ultrasonic signal output from the transparent ultrasonic sensor 1 form a predetermined angle θ1 greater than 0 degrees.

FIG. 1b is a case in which the angle θ1 formed by the two paths P1 and P2 is greater than 0 degrees and smaller than 90 degrees, FIG. 1c is a case in which the angle θ1 formed by the two paths P1 and P2 is 90 degrees, and FIG. 1d is a case in which the angle θ1 formed by the two paths P1 and P2 is greater than 90 degrees.

As shown in FIG. 1b, when the angle θ1 formed by the two paths P1 and P2 is greater than 0 degrees and less than 90 degrees, the transparent ultrasonic sensor 1 is arranged obliquely between the light source module 1 and the object 200. That is, the incident surface S2 of the transparent ultrasonic sensor 1 is disposed inclined with respect to the light exit surface S1 of the light source module 1.

FIG. 1b shows that the transparent ultrasonic sensor 1 is slightly (i.e., less than 90 degrees) inclined with respect to the optical module 100, but on the contrary, the optical module 100 may be arranged to be inclined less than 90 degrees with respect to the transparent ultrasonic sensor 1.

Referring to FIG. 1c, when the angle θ1 formed by the two paths P1 and P2 is 90 degrees, the incident surface S2 of the transparent ultrasonic sensor 1 is 90 degrees with respect to the light exit surface S1 of the light source module 1, and thus, the path P1 of light output from the light source module 100 needs to be changed toward the transparent ultrasonic sensor 1. Accordingly, when the light source module 100 and the transparent ultrasonic sensor 1 are disposed as shown in FIG. 1c, a reflector reflecting light output from the light source module 100 to the transparent ultrasonic sensor 1 may be positioned. In this case, the reflector may be formed of a prism or a mirror. Even in the case of FIG. 1c, as shown in FIG. 1a, a path P1a of light finally incident on the object 200 may match the ultrasonic signal path P2 of the transparent ultrasonic sensor 1.

By the arrangement of FIG. 1c, it is possible to obtain an image of an object facing the side or the like, deviated from the front of the optical module 100, as well as the object 200 facing the optical module 100, i.e., the object 200 of FIG. 1a.

Also, in the case of FIG. 1d, a reflector 300 for changing the path P1 of light from the light source module 100 toward the transparent ultrasonic sensor 1 may be present, like the case of FIG. 1c. Also, in the case of FIG. 1d, the path P1a of light finally incident on the object 200 and the ultrasonic signal path P2 of the transparent ultrasonic sensor 1 may be different from each other like the case of FIG. 1b.

As described above, since the transparent ultrasonic sensor 1 is arranged in various structures between the light source module 100 and the object 200 as the transparent ultrasonic sensor 1 is transparent, the versatility of the design of the system is improved.

In addition, since the arrangement of the transparent ultrasonic sensor 1 is variously changed according to an arrangement space of the optical system including the transparent ultrasonic sensor 1, the degree of freedom of installation of the optical system is also increased.

In the case of FIGS. 1a to 1 d, a distance between the optical module 100 and the transparent ultrasonic sensor 1 is adjustable. Since the distance between the object 200 to obtain a signal and the transparent ultrasonic sensor 1 is different depending on the field to be used, a signal may be obtained at an accurate position by adjusting the distance between the optical module 100 and the transparent ultrasonic sensor 1.

In addition, in the case of the optical module 100, for example, various cameras including a camera having a very small size used in a blood vessel catheter or an endoscope, which is a medical device, to a relatively large size camera used in a vehicle may be applied.

In addition, when the optical module 100 is a laser, when laser light is transmitted through a very thin optical fiber, a laser having a very small size like a camera to a large size may be used.

Next, the present embodiment of the transparent ultrasonic sensor 1 will be described with reference to FIGS. 2a, 2b, 6a, and 6b.

Figure 2A:
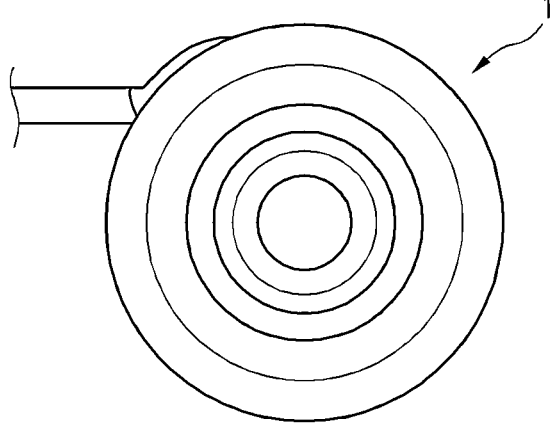
Figure 2B:
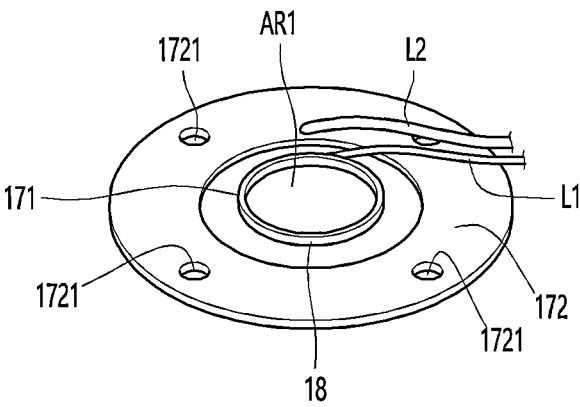

As shown in FIGS. 2a and 2b, the transparent ultrasonic sensor 1 according to an embodiment of the present disclosure has a circular shape having a circular planar shape, but is not limited thereto.

As shown in FIGS. 2a to 4, the transparent ultrasonic sensor 1 according to an embodiment of the present disclosure may include, from the right side, a protective layer 11, an acoustic lens unit 13 positioned behind the protective layer 11, a piezoelectric unit 15 positioned behind the matching unit 13, first and second housings 171 and 173 connected to the piezoelectric unit 15, a rear layer 16 positioned behind the piezoelectric unit 15, an insulating unit 18 positioned between the first and second housings 171 and 173, and a correction lens unit 19 positioned behind the second housing 173.

The protective layer 11 is to physically and electrically protect the transparent ultrasonic sensor 1 and to reduce a difference in acoustic impedance with a medium to which an ultrasonic signal is to be irradiated, that is, the object 200. Accordingly, the protective layer 11 has a protective function and may operate as a matching layer performing acoustic impedance matching between a liquid (e.g., water) and a living body.

The protective layer 11 may be formed of a transparent material. For example, the protective layer 11 may contain a transparent polymer, parylene.

In this example, the acoustic impedance of the protective layer 11 may be about 2.84 Maryls.

Figures 3, 4:
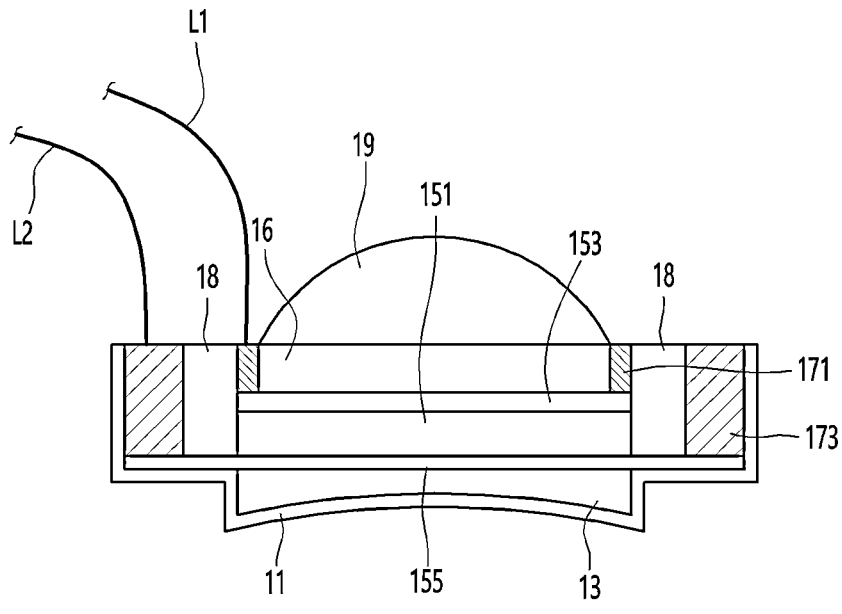
FIG. 3 is a conceptual cross-sectional view obtained when a transparent ultrasonic sensor is cut along one direction according to an embodiment of the present disclosure, in which a correction lens is a plano-convex correction lens having a convex shape, for example.
FIG. 4 is a conceptual exploded perspective view of a transparent ultrasonic sensor according to an embodiment of the present disclosure, in which a correction lens is a plano-convex correction lens having a convex shape, for example.

As shown in FIGS. 3 and 4, the protective layer 11 may be positioned on front and side surfaces of the piezoelectric unit 1 and on a side surface of the second housing 173 positioned at the edge of the transparent ultrasonic sensor 1.

Accordingly, the protective layer 11 may eventually constitute the front and side surfaces of the transparent ultrasonic sensor 1.

The matching unit 13 positioned behind the protective layer 11 is to reduce a difference in acoustic impedance with a medium, i.e., the object 200, to which an ultrasonic signal generated by the piezoelectric unit 15 is to be irradiated.

That is, when an ultrasonic signal is generated by the operation of the piezoelectric unit 15, in order to efficiently transmit the ultrasonic signal in water, biological tissue, or a medium, other than air, the acoustic impedance of the corresponding medium should be adjusted as much as possible to minimize loss.

Each acoustic lens of the matching unit 13 of the present example may be a focused type using an acoustic lens capable of focusing light and ultrasonic signals.

As described above, since the matching unit 13 has a focus adjustment function, the ultrasonic signal reflected by the object 200 and incident on the transparent ultrasonic sensor 1 is accurately focused on a desired position of the piezoelectric unit 15.

Accordingly, a focus of an ultrasonic image obtained by the ultrasonic signal output from the piezoelectric unit 15 is adjusted by the focus adjustment function of the matching unit 13, so that a clear ultrasonic image may be obtained.

Accordingly, the clarity of the image obtained by the operation of the transparent ultrasonic sensor 1 may be improved, so that a clear image may be obtained for a desired part of the object 200 irradiated with the ultrasonic signal.

In addition, since the matching unit 13 uses an acoustic lens, a curve of the surface may be constant and the transparency of the surface may be improved, thereby reducing the loss of the ultrasonic signal when the ultrasonic signal irradiated to the object 200 or reflected from the object 200 is transmitted and received.

In addition, if necessary, an additional transmission or blocking layer may be formed on the matching unit 13 to transmit or block only a signal of a desired wavelength band.

The acoustic lens provided in the matching unit 13 may be formed of at least one of transparent glass, transparent epoxy, and transparent silicone.

Such an acoustic lens may be selected according to the function of the acoustic lens.

For example, when the acoustic lens functions as a matching layer performing an acoustic impedance matching function, if a piezoelectric material provided in the piezoelectric unit 15 is not in the form of a polymer such as PVDF or PVDF-TrFE, It may be more preferable that the acoustic lens is formed of glass.

That is, when the piezoelectric material is formed of lithium niobite (LNO) or PMN-PT, acoustic impedance is as high as 30 to 40 Mrayls, but in the case of glass, acoustic impedance is as low as 10 to 15 Mrayls, which is a numerical value facilitating matching of acoustic impedance and the transparency is very good, and thus, when the piezoelectric material is not in the form of a polymer, the acoustic lens may be formed of glass.

However, in a case in which the matching layer performing the acoustic impedance matching function has already been manufactured, the acoustic lens may be formed of transparent epoxy or transparent silicone.

That is, if a matching layer (about 7 to 20 Mrayls) performing a matching function already exist between a piezoelectric material having acoustic impedance of about 30 to 40 Mrayls and a biological tissue or water having acoustic impedance of about 1 to 2 Mrayls, a separate acoustic impedance matching operation is unnecessary, so epoxies or silicones (about 1 to 3 Mrayls) having acoustic impedance similar to that of biological tissue or water are appropriate. That is, since the acoustic impedance of epoxies and silicones have acoustic impedance almost similar to those of biological tissue or water, separate acoustic impedance matching is unnecessary.

In addition, considering the speed of sound and the speed of sound with respect to a material of the acoustic lens, a curvature of a curved surface of the acoustic lens and whether the acoustic lens is concave or convex may be determined.

Figure 5A:
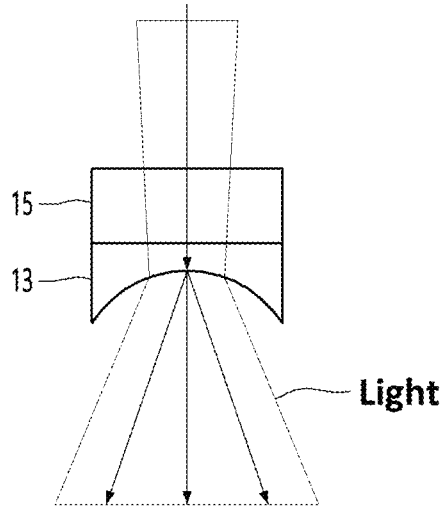
FIGS. 5a and 5b illustrate paths of light when a plano-concave acoustic lens having a plano-concave shape and a plano-convex acoustic lens having a plano-convex shape are used in a transparent ultrasonic sensor according to an embodiment of the present disclosure, respectively.
Figure 5B:
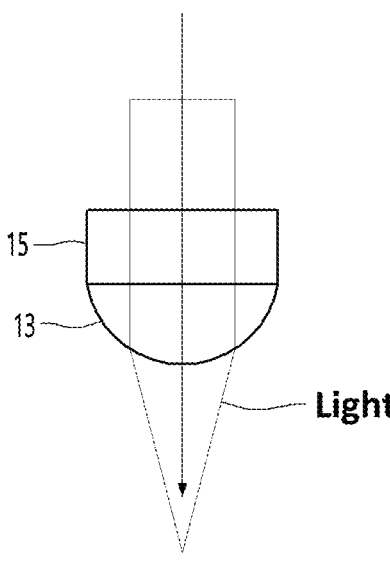
Figure 6A:
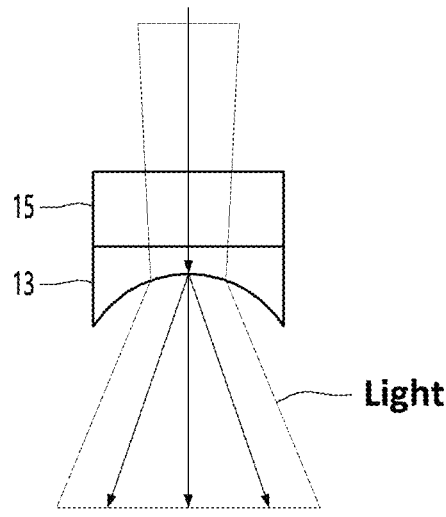
FIGS. 6a and 6b illustrate paths of light when a correction lens is not used and the correction lens is used in a transparent ultrasonic sensor according to an embodiment of the present disclosure, respectively.
Figure 6B:
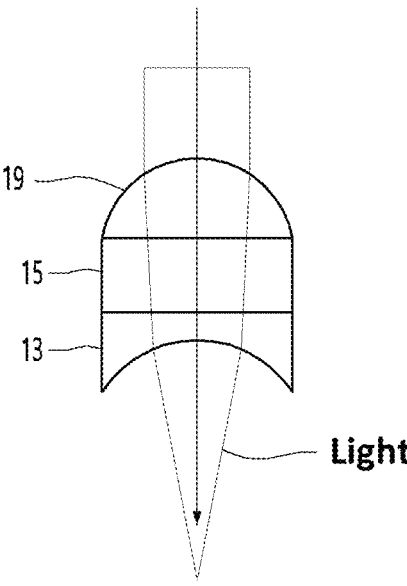

For example, when the acoustic lens is formed of glass, an optical lens may be used. In this case, since the speed of light of glass is higher than that of water, the acoustic lens may be designed in a concave shape such as a plano-concave (e.g., in FIG. 5a.

When the acoustic lens is formed of transparent epoxy, a polishing process should be performed on a primarily manufactured acoustic lens to improve transparency as much as possible to finally complete the acoustic lens. As such, even when the acoustic lens is formed of epoxies, the epoxies have a faster speed of light than water, so the acoustic lens may also be manufactured in a plano-concave shape.

Even when the acoustic lens is formed of transparent silicone, like the case of epoxies, a separate polishing process should be performed to improve a finished acoustic lens as much as possible. In this case, since silicones have a speed of light lower than water, the acoustic lens may be manufactured in a convex shape such as a plano-convex shape (e.g., in FIG. 5a, unlike the cases of glass and epoxies. As such, when the acoustic lens is manufactured in a plano-convex shape, the acoustic lens may have a function of collecting light.

The piezoelectric unit 15, as shown in FIGS. 3 and 4, may include a piezoelectric layer 151 and first and second electrode layers 153 and 1533 positioned on the rear and front surfaces of the piezoelectric layer 151, respectively.

The piezoelectric layer 151 is a layer in which a piezoelectric effect and a converse piezoelectric effect takes place, and may contain a piezoelectric material that is at least one of lithium niobite (LNO), PMN-PT, PVDF, and PVDF-TrFE as described above.

A electromechanical coupling coefficient of LNO is very high as about 0.49, so the electromechanical energy conversion efficiency is very good.

In addition, since LNO has a low dielectric permittivity, when the piezoelectric layer 151 is formed of LNO, the transparent ultrasonic sensor may be suitable for a large aperture single element transducer having a large opening.

In addition, since LNO has a high Curie temperature, LNO may withstand well even at a high temperature, so that the transparent ultrasonic sensor 1 having good heat resistance may be developed.

In addition, when the piezoelectric layer 151 is formed of LNO, a single element ultrasonic sensor having a center frequency of 10 to 400 MHz may be easily developed.

When the piezoelectric layer 151 contains PMN-PT, the piezoelectric performance (d33~1500-2800 pC/N) and electromechanical coupling coefficient (k>0.9) of PMN-PT are very high, so that the performance of the transparent ultrasonic sensor 1 may be improved.

Unlike LNO, PMN-PT has a high dielectric constant, so that the transparent ultrasonic sensor 1 suitable for a small aperture single or array ultrasonic transducer may be developed.

In addition, when the piezoelectric layer 51 contains at least one of PVDF and PVDF-TrFE, the piezoelectric layer 51 may have the following characteristics.

PVDF and PVDF-TrFE have the form of a polymer film, and it is possible to manufacture a piezoelectric layer 51 that is flexible and stretchable, thereby reducing the thickness of the piezoelectric layer 51 and it may be possible to manufacture the transparent ultrasonic sensor 1 for a signal of a high frequency band of about 100 MHz by the reduced thickness.

In addition, PVDF and PVDF-TrFE have a relatively low electromechanical coupling coefficient and high receiving constant, have a wider bandwidth compared to other piezoelectric materials, and may be easy to manufacture in either a single device or an array type device.

Here, a single element (e.g., a single ultrasonic transducer) may refer to an ultrasonic transducer in which the number of all components including a piezoelectric material is one. In addition, an array-type element (e.g., an array ultrasonic transducer) may be an ultrasonic transducer in which the number of all components including a piezoelectric material is plural (n), and generally may be configured in a form mainly used in hospitals. In this case, the shape may be a linear shape, a convex shape, a 2D matrix, or the like.

In this example, similar to PMN-PT, it may be possible to manufacture both single or array ultrasonic transducers with small apertures.

The material characteristics of the piezoelectric layer 151 may be summarized in Table 1 below.

TABLE 1

|  | LNO | PMN-PT | PVDF & PVDF-TrFE |
| --- | --- | --- | --- |
| Size | Large | Small | Medium |
| Size of band width | Medium | Medium | broad |
| Available frequency range | 1~400 MHz | 1~100 MHz | 1 kHz~100 MHz |
| Signal transmission performance | Good | Good | Bad |
| Signal reception performance | Good | Good | Good |
| Electric machine coupling coefficient | Medium | Good | Bad |

The first and second electrode layers 153 and 155 respectively positioned on the front and rear surfaces of the piezoelectric layer 151 may receive a (+) drive signal and a (−) drive signal from a drive signal generator (not shown), respectively, and exhibit a converse piezoelectric effect on the piezoelectric layer 151 so that an ultrasonic signal may be transmitted toward the object 200, and conversely, receive an electrical signal generated by the piezoelectric effect of the piezoelectric layer 151 based on the ultrasonic signal received after being reflected by the object 200 to be output externally. The first and second electrode layers 153 and 155 may be formed of a transparent conductive material as described above, and may contain, for example, at least one of silver nanowire (AgNW), ITO, carbon nanotube, and graphene.

As shown in FIG. 3, for easy coupling with the first housing 171 and the second housing 173, a size of the first electrode layer 153 and a size of the second electrode layer 155 may be different from each other.

Accordingly, as shown in FIG. 3, in the first and second electrode layers 9153 and 155 having a circular planar shape, a diameter of the second electrode layer 155 is different from a diameter of the first electrode layer 153, so that a portion (e.g., an edge portion) of the second electrode layer 155 may be drawn out from the edge portion of the first electrode layer 153.

When an electrical signal (e.g., a pulse signal) is applied to the piezoelectric material, the piezoelectric material (i.e., the piezoelectric layer 151) vibrates back and forth to generate an ultrasonic signal, and the ultrasonic signal may also be generated even from a rear surface of the piezoelectric layer 151 facing the object 200, as well as a front surface opposite to the rear surface.

At this time, since the ultrasonic signal generated from the rear surface is not transmitted toward the object 200, the ultrasonic signal generated from the rear surface acts as a noise signal. Also, a portion of the ultrasonic signal reflected by the object 200 and returned may pass through the matching unit 15 and output toward the correction lens unit 19.

Therefore, the rear layer 16 is positioned on the rear surface of the piezoelectric unit 15 to damp the ultrasonic signal generated from the rear surface of the piezoelectric unit 15 and to damp the ultrasonic signal reflected by the object 200.

As such, since the rear layer 16 is positioned on the rear surface of the piezoelectric unit 15 (that is, the surface positioned opposite to the front surface of the piezoelectric unit 15 on which the reflected ultrasonic signal is incident), the incident ultrasonic signal does not pass through the rear surface of the piezoelectric unit 15.

Accordingly, unnecessary signal interference by the ultrasonic signal passing through the rear surface of the piezoelectric unit 15 may be prevented, and loss of the ultrasonic signal reflected by the piezoelectric unit 15 may be prevented, thereby reducing a ring down signal to reduce ring down phenomenon.

Ring down, as a phenomenon in which unnecessary signals are elongated in a time axis, is a factor adversely affecting image generation.

Accordingly, the rear layer 16 may be appropriately manufactured by adjusting at least one of acoustic impedance and thickness in order to reduce the ring-down phenomenon.

When the rear layer 16 is formed of a material having a high acoustic impedance, the ring-down phenomenon is reduced, and the reduction of the ring-down phenomenon on the time axis is similar to the meaning of widening of a bandwidth in a frequency domain. However, instead, a magnitude of the entire ultrasonic signal may also be damped by the rear layer 16 during transmission and reception of the ultrasonic signal.

Conversely, when the rear layer 16 is formed of a material having a relatively low acoustic impedance, the bandwidth may be reduced without significantly reducing the ring down phenomenon, but the amount of transmission and reception of ultrasonic signals may be increased.

The rear layer 16 may also be formed of a transparent non-conductive material, and may be formed of, for example, transparent epoxy (e.g., Epotek301) or transparent glass.

When the rear layer 16 is formed of Epotek301, if the acoustic impedance is as low as 3.1 Mrayls, low signal damping is achieved, so that the transparent ultrasonic sensor 1 may obtain a relatively high signal.

In addition, Epotek301 has a very high transparency such as having a transparency of about 95% or more at a wavelength of 380 nm to 2000 nm and cured at room temperature, and thus, the rear layer 16 is easily manufactured.

When the rear layer 16 is formed of glass, transparency and flatness are high and a separate curing process is unnecessary.

When the glass has an acoustic impedance of about 13 Mrayls, a pulse length is reduced due to a high signal damping operation in the rear layer 16, which reduces the ring-down effect but exhibits the effect of increasing the bandwidth of the frequency of the transparent ultrasonic sensor 1.

The rear layer 16 may be omitted if necessary.

The first housing 171 and the second housing 173 are respectively connected to the first electrode layer 153 and the second electrode layer 155 as described above. Accordingly, the first housing 171 and the second housing 173 may be formed of a transparent conductive material containing a conductive material (e.g., copper) through which an electric signal is transmitted.

Accordingly, as shown in FIG. 3, the first housing 171 may receive a corresponding signal through a first signal line L1 and transmit the received signal to the first electrode layer 153, and conversely, may output a signal applied from the first electrode layer 153 to the first signal line L1.

The second housing 173 may also receive the corresponding signal through a second signal line L2, which is a separate signal line from the first signal line L1, and transmits the received signal to the second electrode layer 155, and conversely, may output from a signal applied from the second electrode layer 155 to the second signal line L2.

In this example, the signal input to the first signal line L1 may be a pulse signal, and the signal flowing into the second signal line L2 may be a ground signal or a shield signal (−), so that the first housing 171 may transfer the pulse signal to the first electrode layer 153, and the second housing 173 may transfer the ground signal to the second electrode layer 155.

The first housing 171 and the second housing 173 may have a ring shape as shown in FIG. 4 and may be positioned to be in contact with the edge portion of the corresponding electrode layers 153 and 155, respectively, in contact therewith, i.e., in contact with a circular side surface.

That is, the first electrode layer 153 and the second electrode layer 155 may be inserted and mounted into an empty space positioned inside the first housing 171 and the second housing 173.

Accordingly, as shown in FIGS. 2a and 2b, the first housing 171 and the second housing 173 may be positioned to surround an actual active region AR1 of the transparent ultrasonic sensor 1, thereby minimizing a reduction in the active region AR1 due to the first and second housings 171 and 173, substantially, the first housing 171.

As described above, since the first housing 171 and the second housing 173 serve to transmit electrical signals to the corresponding electrode layers 153 and 155, the first housing 171 and the second housing 173 may contain a material having good conductivity.

Since the first housing 171 is positioned at the edge portion of the first electrode layer 151 positioned on the entire rear surface of the piezoelectric layer 151 through which light is received, the first housing 171 may have a width W11 as thin as possible and may have a thickness as thick as possible to minimize a signal loss rate due to wiring resistance or the like.

As shown in FIGS. 3 and 4, the second housing 173 is coupled to the second electrode layer 155 having a larger diameter than the first electrode layer 153, and thus has a larger diameter than the first housing 171.

In addition, since the second housing 173 is positioned on an outer side than the first housing 171 to serve to protect the transparent ultrasonic sensor 1, the second housing 173 may have a width and thickness greater than the width and thickness of the first housing 171.

Accordingly, as shown in FIG. 3, the first electrode layer 153 and the first housing 171 may be positioned in the second housing 173.

In addition, as already described, an outer surface of the second housing 173 exposed to the outside is covered with the protective layer 11 to prevent a noise signal from being introduced into the transparent ultrasonic sensor 1 through the second housing 173.

As illustrated in FIGS. 2a, 2b, and 3, since the second housing 173 does not affect a light receiving area of the piezoelectric layer 151, a size thereof may be increased as necessary.

In addition, a desired optical component may be coupled to the second housing 173 by forming a screw thread 1731 or a connector on the second housing 173. In this case, the second housing 173 may function as a coupling portion for coupling with other components.

The insulating unit 18 may be positioned between the first housing 171 and the second housing 173 that transmits the corresponding electric signals to the corresponding electrode layers 153 and 155 and is positioned in contact with the corresponding housings 171 and 173 to insulate the first housing 171 and the second housing 173 to prevent an electric short or short and serve to fix the positions of the first housing 171 and the second housing 173.

The insulating unit 18 may be formed of a transparent insulating material such as non-conductive epoxy. When the matching unit 13 uses a plano-concave acoustic lens as an example, a focus of light and an ultrasonic signal incident after being reflected from the object 200 may be adjusted by the acoustic lens of the matching unit 13, but after passing through the matching unit 13, a light spreading phenomenon may occur (refer to FIG. 6a).

In this case, a curvature of the correction lens unit 19 may be selectively used according to a position at which light is finally positioned.

As such, the correction lens unit 19 affects only the focus of light regardless of the focus of the ultrasonic signal, but the acoustic lens of the matching unit 13 may affect both the focus of the ultrasonic signal and the focus of the light.

The correction lens unit 19 may be omitted if necessary, and a focal length of light may be adjusted by changing the correction lens unit 19.

In addition, the correction lens unit 19 may have a confocal function of simultaneously adjusting the focus of the reflected and received ultrasonic signal and the focus of the light. However, when the correction lens unit 19 has a confocal function, the correction lens unit 19 should be designed in consideration of the shape of light before passing through the transparent ultrasonic sensor 1.

In this example, the correction lens unit 19 includes a single lens, but is not limited thereto. In addition to a single lens such as a plano-convex lens, the correction lens unit 19 may additionally include a lens for aberration correction to include a plurality of lenses.

The transparent ultrasonic sensor 1 of this example in which all the components (e.g., 11 to 16 and 19) positioned in the active region AR1 of the transparent ultrasonic sensor 1 having such a structure are formed of a transparent material through which light is transmitted may have the following characteristics:

First, since the optical impedance is matched, that is, matched by the operation of the matching unit 13, the reliability of a signal output from the transparent ultrasonic sensor 1 may be improved.

In addition, due to the use of the acoustic lens having a focus adjustment function used in the matching unit 13, the focus of light reflected by the object 200 and the ultrasonic signal is adjusted so that light and the ultrasonic signal may be focused at an accurately desired position of the piezoelectric unit 15. Accordingly, the clarity of the ultrasonic image obtained by the signal output from the transparent ultrasonic sensor 1 may be significantly improved, so that not only the presence of the corresponding object 200 but also an accurate shape of the detected object 200 may be recognized.

In addition, as already described, since the components (e.g., 11 to 16 and 19) constituting the transparent ultrasonic sensor 1 are all formed of transparent materials such as transparent glass, transparent epoxy, and transparent silicone, light output from the optical module 100 may directly pass through the transparent ultrasonic sensor 1 and be irradiated toward the corresponding object 200.

Accordingly, the arrangement of the optical system including the transparent ultrasonic sensor 1 is free and the utilization of the space in which the optical system is installed may be improved.

In addition, the correction lens unit 19 may be selectively used according to the user's needs, and the focal length of light may be adjusted by changing the correction lens unit 19.

In addition, when an optical lens having a plano-concave shape with a coating for 400 to 1000 nm is used as the acoustic lens, light may easily transmit at 400 to 1000 nm, so that the clarity of an ultrasonic image may be improved.

When the optical lens having a plano-concave shape is used as the acoustic lens 13, the phenomenon of light spreading due to the acoustic lens may occur but may be supplemented by the correction lens unit 19 and a focus of light may be adjusted at a desired point. In this manner, the range of selection of the acoustic lens may be widened by the use of a compensating lens.

The shape of light is maintained by focusing adjustment by the acoustic lens 13 and the correction lens unit 19, and accordingly, a fine focus may be maintained, so that a high-resolution optical image (e.g., photoacoustic image or optical coherence tomography image) may be obtained.

In addition, the first and second signal lines L1 and L2 are connected to the first and second housings 171 and 173 constituting the housing of the transparent ultrasonic sensor 1, respectively, to apply an electrical signal to the first and second electrodes 153 and 155, the signal lines L1 and L2 may be easily connected.

Furthermore, by forming a screw thread 1731 or the like in the second housing 173, which is an outer housing, connection or coupling with other optical elements may be facilitated. In this manner, since a required optical element is coupled to the second housing 173 positioned at a portion completely unrelated to a path of light exit from the optical module 100, light is normally incident on the piezoelectric unit 15 of the transparent ultrasonic sensor 1 without loss, and since light passes through the center of the transparent ultrasonic sensor 1 in a normal direction, light and an ultrasonic signal may be easily aligned.

Here, being perpendicular may mean that light travels in a direction perpendicular to an incident surface of the transparent ultrasonic sensor (e.g., the transparent ultrasonic transducer).

As such, when light is vertically incident on the ultrasonic sensor, the focal positions of the light and the ultrasonic signal may exactly match, and thus the clarity of an image obtained from the transparent ultrasonic sensor may be further improved.

As already described, a matching layer for minimizing ultrasonic energy loss in a medium due to a difference in acoustic impedance between the air and the medium may be present.

There may be more than one matching layer.

In a comparative example, the matching layer may be formed as follows.

When a medium of an ultrasonic signal is water or biological tissue (1.5 Mrayls), acoustic impedance matching is required for maximum transmission/reception efficiency of ultrasonic energy when a piezoelectric layer is LNO (34.5 Mrayls) or PMN-PT (37.1 Mrayls). In this case, more than one matching layer of material between 37.1 and 1.5 Mrayls may be required.

At this time, when a specific matching layer is generated using a KLM simulation tool (PiezoCAD, PZFLEX, etc.), a waveform of an ultrasonic signal transmitted from water or biological tissue should be checked through simulation to find a material of an appropriate matching layer, and since a thickness of the generated matching layer also significantly affects a waveform of the ultrasonic wave, the thickness of the matching layer needs to be adjusted to find an appropriate thickness. Theoretically, a thickness of a minimum loss of wave energy is a minimum loss at a desired thickness of $\lambda/4$ by a wave equation ($c=\lambda*f$, c: speed of sound about 1480 m/s, $\lambda$: wavelength, f: desired center frequency).

In a typical ultrasonic sensor, a first matching layer is often formed of a mixture (7.9 Mrayls) of silver powder and epoxy. At this time, it is possible to adjust acoustic impedance according to a mixing ratio of the silver powder and the epoxy, and, for example, silver powder:epoxy=3:1.25.

Thereafter, a second matching layer may be generated by parylene (2.8 Mrayls) coating.

If the piezoelectric layer is PVDF or PVDF-TrFE (about 4 Mrayls), only parylene coating may be used to generate one matching layer. Here, the matching layer formed by parylene coating may serve not only as a matching layer but also as protection and insulation from the outside.

However, in the case of the transparent ultrasonic sensor 1 according to the present example, since the components (e.g., 11 to 16 and 19) positioned in the active region AR1 are transparent, the matching layer 13 may be formed using glass in the case of LNO or PMN-PT constituting the piezoelectric layer. At this time, it is slightly different depending on a raw material of glass (e.g. borosilicate glass=13 Mrayls, crown glass=14.2 Mrayls, quartz=14.5 Mrayls, plate glass=10.7 Mrayls, sodalime glass=13 Mrayls), so desired glass may be appropriately selected and used.

Thereafter, a second matching layer (e.g., 2 to 6 Mrayls) may be generated using transparent epoxies or silicones (e.g., PDMS), and a third matching layer may be generated using parylene coating. In this case, generating of the second matching layer may be omitted and the second matching layer (e.g., 11) may be formed on the first matching layer (e.g., 13) directly using parylene coating. Also, in this case, a desired matching layer may be generated using a simulation waveform resulting from a KLM simulation.

In the transparent ultrasonic sensor 1 according to this example, as an example, an optical lens formed of borosilicate is used as the first matching layer, and a second matching layer is formed on the first matching layer through parylene coating, so that acoustic impedance matching and protection and signal isolation from the outside were implemented.

As already described, the optical lens may perform not only the function of acoustic impedance matching, but also focusing, that is, focusing the ultrasonic signal generated from the piezoelectric layer.

Since the transparent ultrasonic sensor 1 is mainly used for image acquisition, focusing of an ultrasonic signal is a factor which significantly affects high resolution and high sensitivity.

Next, a method of manufacturing the transparent ultrasonic sensor 1 according to the present example will be described with reference to FIGS. 7a to 7k.

Figure 7A:
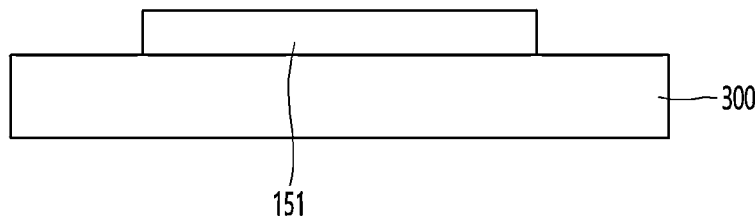
FIGS. 7a to 7k are diagrams illustrating a method of manufacturing a transparent ultrasonic sensor according to an embodiment of the present disclosure.

First, as shown in FIG. 7a, the piezoelectric layer 151 formed of LNO is attached and positioned on a substrate 300. In this case, the piezoelectric layer 151 may have a predetermined transparency in a state in which front and rear surfaces thereof are polished using a high-speed polishing machine or the like.

At this time, a thickness of the piezoelectric layer 151 may vary depending on a center frequency of a transparent ultrasonic sensor to be manufactured (generally, thickness=wavelength/2), and the thickness is constant at all positions, so that both surfaces of the piezoelectric layer 151 may have a flat surface.

Figure 7B:
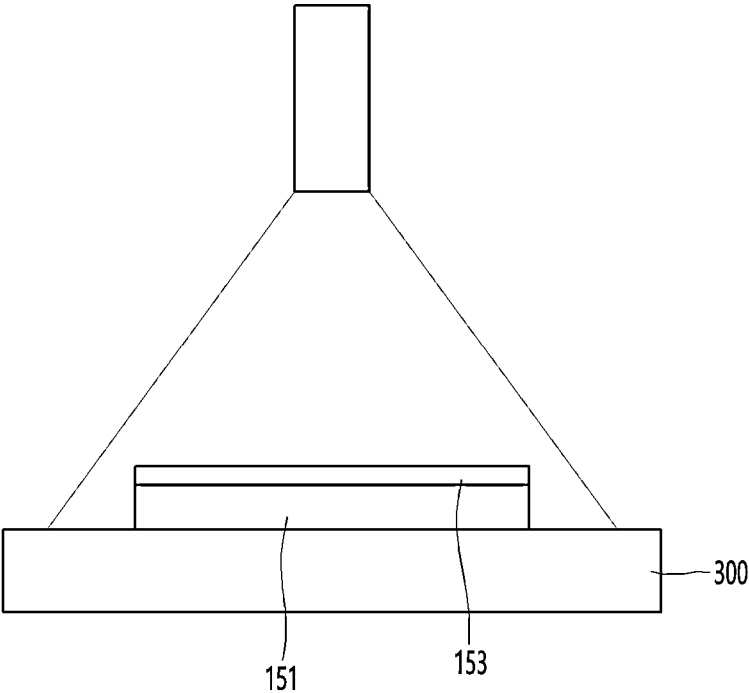

Next, as shown in FIG. 7b, a transparent conductive material such as AgNWs may be coated on one surface of the piezoelectric layer 151 exposed to the outside using a spray coating method or a spin coating method to form the first electrode layer 153. In this case, the first electrode layer 153 may be manufactured in various manners other than the coating method.

Figure 7C:
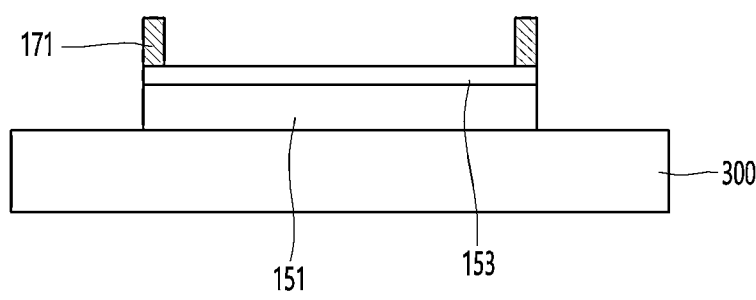

As shown in FIG. 7c, after applying conductive epoxy or the like to an edge portion of the first electrode layer 153, the ring-shaped first housing 171 is positioned and cured, and the first housing 153 is attached to the first electrode layer 153.

Figure 7D:
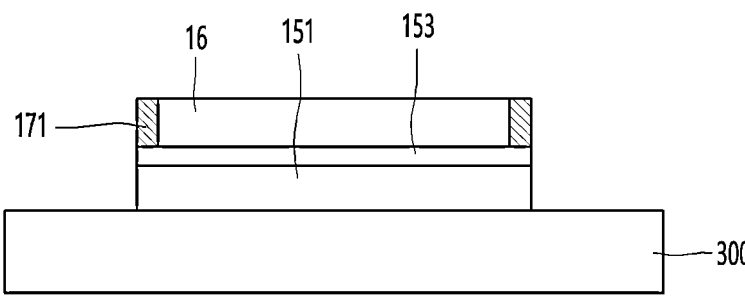

Thereafter, a liquid transparent non-conductive material such as transparent epoxy is injected on the first electrode layer 153 exposed through an inner space of the first housing 171 surrounded by the first housing 171 and then cured (e.g., at room temperature for 24 hours) to form the rear layer 16 in contact with the exposed surface of the first electrode layer 173 (FIG. 7d). At this time, a thickness of the formed rear layer 16 may be determined according to a protrusion height of the first housing 171 positioned on the first electrode layer 153, and a rear surface, which is the exposed surface of the rear layer 16, is a flat surface, so that light or laser passing through the transparent ultrasonic sensor 1 is not refracted.

Figure 7E:
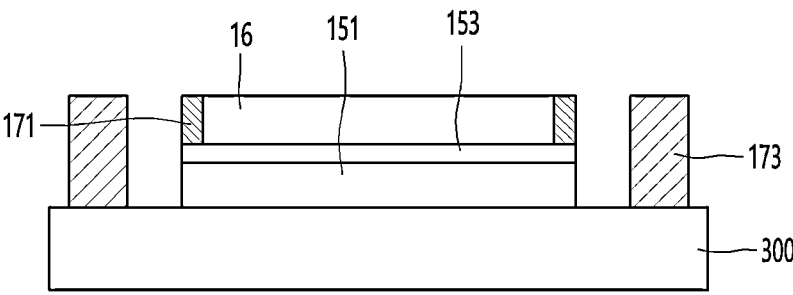

Next, as shown in FIG. 7e, the ring-shaped second housing 173 formed of a conductive material having conductivity similar to that of the first housing 171 is attached to the edge portion of the substrate 300 and positioned. At this time, as shown in FIG. 7e, the second housing 173 is positioned on the outer side of the piezoelectric layer 151 on which the first housing 171 is installed, and spaced apart from the first housing 171 for electrical insulation, and the piezoelectric layer 151 is positioned in an inner space surrounded by the second housing 173.

In this case, a protrusion height of the second housing 173 from the substrate 300 may be the same as the protrusion height of the first housing 171.

Figure 7F:
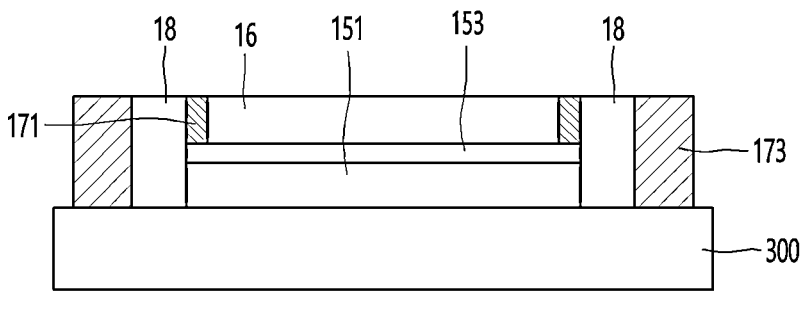

Next, a non-conductive epoxy, which is an insulating material, is injected between the first housing 171 and the second housing 173 that are spaced apart from each other and then cured to form an insulating unit 18 on the first housing 171 and the second housing 173 (FIG. 7f).

At this time, a height of an upper end of the insulating unit 18 may be the same as the protrusion heights of the first and second housings 171 and 173 positioned on both sides, that is, heights of upper ends of the positioned first and second housings 171 and 173. The first housing 171 and the second housing 173 are coupled to a corresponding portion of the insulating unit 18 by the insulating unit 18.

Figure 7G:
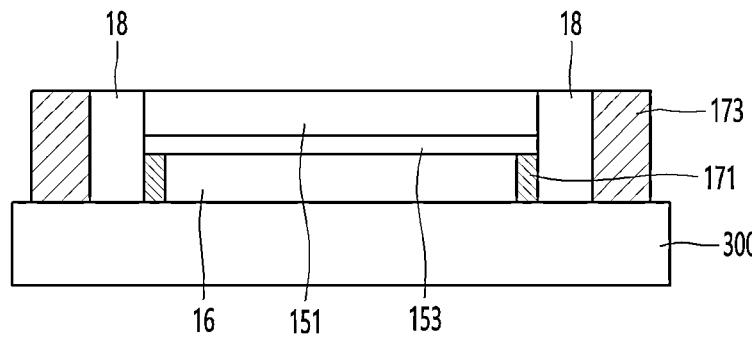

As such, when a preliminary transparent ultrasonic sensor including even the first and second housings 171 and 173 is manufactured, the preliminary transparent ultrasonic sensor positioned on the substrate 300 is turned over by 180 degrees in an vertical direction and then positioned on the substrate 300 again. (FIG. 7g). Due to this position change, the first housing 171 is positioned in contact with the substrate 300, and the other surface (e.g., A front surface) of the piezoelectric layer 151 is exposed to the outside.

Figure 7H:
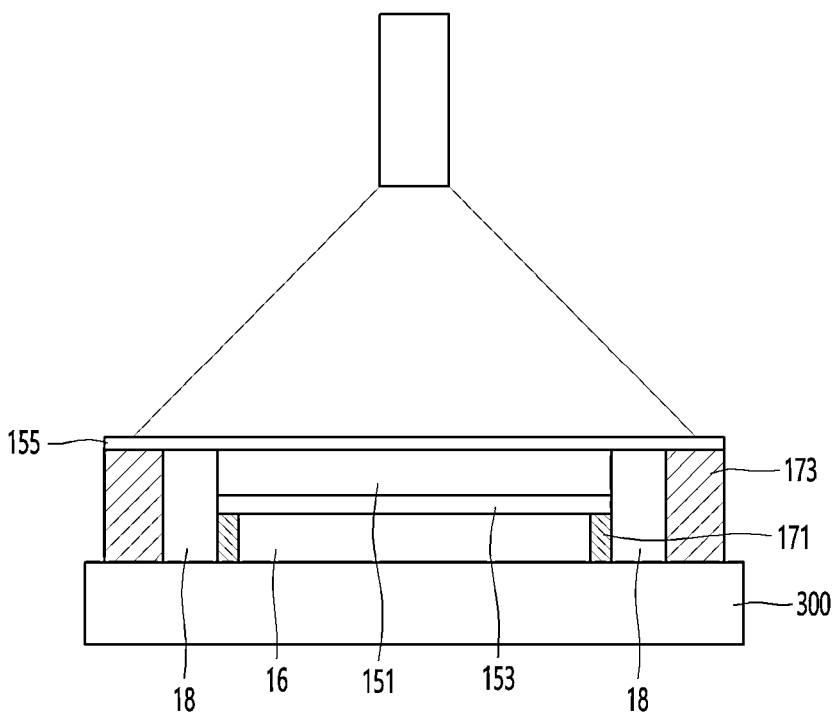

Next, as shown in FIG. 7h, a layer formed of a transparent conductive material such as AgNWs is formed as the second electrode layer 155 on an exposed surface of the piezoelectric layer 151, a surface of the insulating unit 18, and a surface of the second housing 173 through various layer forming methods such as a spray coating method or a spin coating method.

Figure 7I:
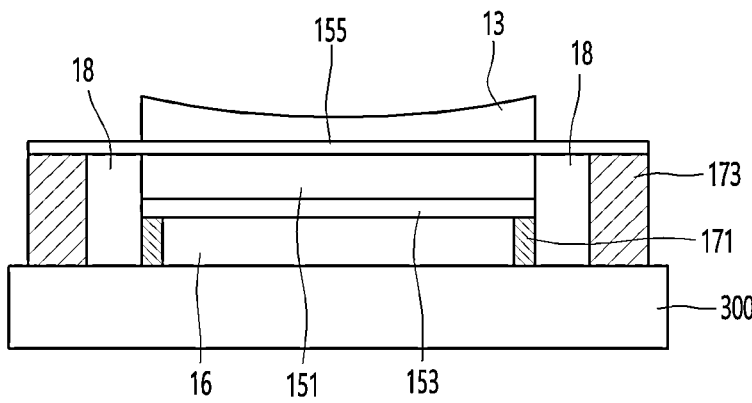

Thereafter, a matching unit 13 is formed at a corresponding position on the exposed first electrode layer 155 using transparent glass, transparent epoxy, or transparent silicone (FIG. 7i). A thickness of the matching unit 13 that affects the efficiency of the transparent ultrasonic sensor 1 may be determined according to a magnitude of a center frequency of an ultrasonic signal.

The matching unit 13 may not be positioned at an edge portion of the second electrode layer 155.

Figure 7J:
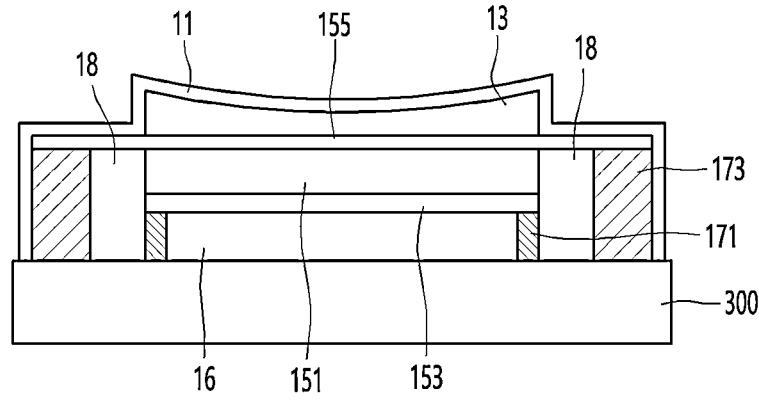

Thereafter, as shown in FIG. 7j, the protective layer 11 is formed on all the exposed surfaces, that is, on a side surface of the second housing 173, an exposed surface of the matching unit 13, and a surface of the second electrode layer 173 exposed because the matching unit 13 is not positioned, using a parylene coating method.

Figure 7K:
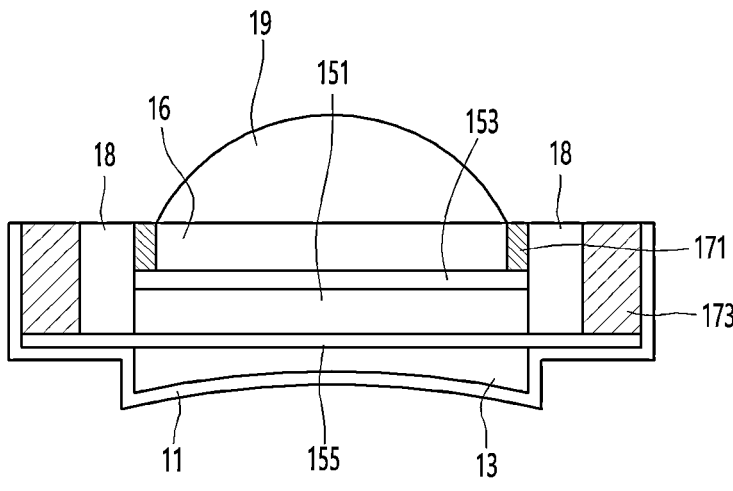

Thereafter, the preliminary transparent ultrasonic sensor manufactured so far is rotated by 180 degrees in a vertical direction, and a concave lens is formed on the exposed rear layer 16 to form a correction lens unit 19 (FIG. 7k).

Finally, the first electric wire L1 and the second electric wire L2 are connected to the first housing 171 and the second housing 173, respectively, to complete the transparent ultrasonic sensor 1 (refer to FIG. 3).

When the correction lens unit 19 is omitted, the preliminary transparent ultrasonic sensor manufactured up to FIG. 7j is rotated by 180 degrees in the vertical direction, and the first signal line L1 and the second signal line L2 may be connected to the first housing 171 and the second housing 173, respectively, to complete the transparent ultrasonic sensor 1.

The technical features disclosed in each embodiment of the present disclosure are not limited only to the corresponding embodiment and may be combined and applied to different embodiments unless they are mutually incompatible.

In the above, embodiments of the transparent ultrasonic sensor of the present disclosure have been described. The present disclosure is not limited to the embodiments described above and the accompanying drawings, and various modifications and variations may be made from the viewpoint of a person skilled in the art to which the present disclosure pertains. Therefore, the scope of the present disclosure should be defined by the equivalents of claims of the present disclosure as well as the claims.

DETAILED DESCRIPTION OF MAIN ELEMENTS

1: transparent ultrasonic sensor
11: protective layer
13: matching unit
15: piezoelectric unit
151: piezoelectric layer
153: first electrode layer
155: second electrode layer
16: rear layer
171: first housing
173: second housing
18: insulating unit
19: correction lens

The invention claimed is:

1. A transparent ultrasonic sensor comprising:
a matching unit configured to perform optical impedance matching and formed of a transparent material;
a piezoelectric layer positioned behind the matching unit and formed of a transparent material;
a first electrode layer and a second electrode layer positioned on a rear surface and a front surface of the piezoelectric layer, respectively, the first electrode layer and the second electrode layer being formed of a transparent conductive material;
a first housing connected to the first electrode layer;
a second housing connected to the second electrode layer; and
a correction lens positioned behind the matching unit, controlling a focus of light passing through the matching unit, and formed of a transparent material.

2. The transparent ultrasonic sensor of claim 1, wherein the matching unit includes an acoustic lens.

3. The transparent ultrasonic sensor of claim 2, wherein the acoustic lens has a concave shape or a convex shape.

4. The transparent ultrasonic sensor of claim 1, wherein the matching unit contains at least one of transparent glass, transparent epoxy, and transparent silicone.

5. The transparent ultrasonic sensor of claim 1, wherein the piezoelectric layer contains at least one of LNO, PMN-PT, PVDF, and PVDF-TrFE.

6. The transparent ultrasonic sensor of claim 1, wherein the first electrode layer and the second electrode layer each contain at least one of AgNW, ITO, carbon nanotubes, and graphene.

7. The transparent ultrasonic sensor of claim 1, wherein sizes of the first electrode layer and the second electrode layer are different from each other.

8. The transparent ultrasonic sensor of claim 7, wherein each of the first housing and the second housing is formed in a ring shape having an empty space in a middle.

9. The transparent ultrasonic sensor of claim 8, wherein the first housing is positioned in contact with an edge portion of the first electrode layer, and the second housing is positioned in contact with an edge portion of the second electrode layer.

10. The transparent ultrasonic sensor of claim 9, wherein the piezoelectric layer, the first electrode layer, and the first housing are positioned in an inner space of the second housing.

11. The transparent ultrasonic sensor of claim 9, wherein the first housing and the second housing contain a conductive material.

12. The transparent ultrasonic sensor of claim 9, further comprising a first signal line connected to the first housing and a second signal line connected to the second housing.

13. The transparent ultrasonic sensor of claim 9, further comprising an insulating unit positioned between the first housing and the second housing and formed of a transparent insulating material.

14. The transparent ultrasonic sensor of claim 8, further comprising a rear layer positioned in contact with the first electrode layer and damping an ultrasonic signal.

15. The transparent ultrasonic sensor of claim 14, wherein the rear layer is surrounded by the first housing.

16. The transparent ultrasonic sensor of claim 14, wherein the rear layer contains transparent glass or transparent epoxy.

17. The transparent ultrasonic sensor of claim 1, further comprising a protective layer positioned in front of the matching unit and performing acoustic impedance matching.

18. The transparent ultrasonic sensor of claim 17, wherein the protective layer contains parylene.

19. The transparent ultrasonic sensor of claim 1, wherein the correction lens has a convex shape.

20. A transparent ultrasonic sensor comprising:
a matching unit configured to perform optical impedance matching and formed of a transparent material;
a piezoelectric layer positioned behind the matching unit and formed of a transparent material;
a first electrode layer and a second electrode layer positioned on a rear surface and a front surface of the piezoelectric layer, respectively, the first electrode layer and the second electrode layer being formed of a transparent conductive material;
a first housing connected to the first electrode layer;
a second housing connected to the second electrode layer; and
a correction lens positioned behind the matching unit, controlling a focus of light passing through the matching unit, and formed of a transparent material,
wherein each of the first housing and the second housing is formed in a ring shape having an empty space in a middle of the ring shape.

* * * * *